United States Patent
Ito et al.

(10) Patent No.: US 11,735,346 B2
(45) Date of Patent: Aug. 22, 2023

(54) MULTILAYER SUBSTRATE AND METHOD FOR MANUFACTURING THE SAME

(71) Applicant: Murata Manufacturing Co., Ltd., Nagaokakyo (JP)

(72) Inventors: Shingo Ito, Nagaokakyo (JP); Kuniaki Yosui, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 1245 days.

(21) Appl. No.: 16/116,963

(22) Filed: Aug. 30, 2018

(65) Prior Publication Data

US 2018/0374623 A1   Dec. 27, 2018

Related U.S. Application Data

(63) Continuation of application No. PCT/JP2017/007012, filed on Feb. 24, 2017.

(30) Foreign Application Priority Data

Mar. 16, 2016 (JP) ................................. 2016-051842

(51) Int. Cl.
  *H01F 17/00*   (2006.01)
  *H01L 23/498*   (2006.01)
  (Continued)

(52) U.S. Cl.
  CPC ..... *H01F 17/0013* (2013.01); *H01F 27/2804* (2013.01); *H01F 27/292* (2013.01);
  (Continued)

(58) Field of Classification Search
  CPC ............. H01F 17/0013; H01F 27/2804; H01F 2027/2809; H01F 17/0006; H01F 5/003;
  (Continued)

(56) References Cited

U.S. PATENT DOCUMENTS 8,193,781 B2* 6/2012 Lin .................. H02K 35/02
                                                336/200
2002/0101322 A1* 8/2002 Liu .................. H01F 17/0013
                                                257/E27.046
(Continued)

FOREIGN PATENT DOCUMENTS

JP   09-330816 A   12/1997
JP   2008-198929 A   8/2008
(Continued)

OTHER PUBLICATIONS

Official Communication issued in International Patent Application No. PCT/JP2017/007012, dated Mar. 21, 2017.

*Primary Examiner* — Tszfung J Chan
(74) *Attorney, Agent, or Firm* — Keating & Bennett, LLP

(57) ABSTRACT

A multilayer substrate includes at least three coil conductors respectively patterned on different surfaces of a first main surface of a laminated body, a second main surface of the laminated body, and laminated interfaces of insulating base materials and that are arranged in a lamination direction. The at least three coil conductors include first and second coil conductors, and are connected in series between first and second external electrodes. A surface at which another coil conductor is provided is not interposed between two surfaces at which the first and second coil conductors are provided, respectively. Further, the first and second coil conductors are directly connected to the first and second external electrodes, respectively, without another coil conductor interposed therebetween.

15 Claims, 10 Drawing Sheets

(51) Int. Cl.
*H01L 21/48* (2006.01)
*H01F 27/28* (2006.01)
*H01F 27/29* (2006.01)
*H05K 1/02* (2006.01)
*H05K 1/16* (2006.01)
*H05K 1/18* (2006.01)
*H05K 3/46* (2006.01)

(52) U.S. Cl.
CPC .... *H01L 21/4857* (2013.01); *H01L 23/49822* (2013.01); *H05K 1/0268* (2013.01); *H05K 1/165* (2013.01); *H05K 1/18* (2013.01); *H05K 3/4632* (2013.01); *H01F 2027/2809* (2013.01); *H05K 3/4617* (2013.01); *H05K 2201/0129* (2013.01); *H05K 2201/0141* (2013.01); *H05K 2201/0154* (2013.01); *H05K 2201/09672* (2013.01)

(58) Field of Classification Search
CPC ....... H01F 27/29; H01F 27/292; H05K 1/165; H05K 1/0268; H05K 2201/0141; H05K 1/18; H05K 3/4632; H05K 2201/0129
USPC .................................................. 336/200, 232
See application file for complete search history.

(56) References Cited

U.S. PATENT DOCUMENTS

| | | | | |
|---|---|---|---|---|
| 2007/0139151 | A1* | 6/2007 | Nussbaum | H03F 1/565 336/200 |
| 2008/0197963 | A1* | 8/2008 | Muto | H01F 17/0013 336/200 |
| 2011/0102124 | A1* | 5/2011 | Matsushita | H01F 17/0013 336/200 |
| 2013/0214888 | A1* | 8/2013 | Nogi | H01F 27/29 336/192 |
| 2014/0077914 | A1* | 3/2014 | Ohkubo | H01F 5/00 75/255 |
| 2017/0011838 | A1 | 1/2017 | Asada | |

FOREIGN PATENT DOCUMENTS

| | | | | |
|---|---|---|---|---|
| JP | 2015-201606 A | | 11/2015 | |
| WO | 2010/007858 A1 | | 1/2010 | |
| WO | WO-2015005161 A1 * | | 1/2015 | ......... H01F 17/0013 |
| WO | 2015/152333 A1 | | 10/2015 | |

* cited by examiner

MULTILAYER SUBSTRATE AND METHOD FOR MANUFACTURING THE SAME

CROSS REFERENCE TO RELATED APPLICATIONS

This application claims the benefit of priority to Japanese Patent Application No. 2016-051842 filed on Mar. 16, 2016 and is a Continuation Application of PCT Application No. PCT/JP2017/007012 filed on Feb. 24, 2017. The entire contents of each application are hereby incorporated herein by reference.

BACKGROUND OF THE INVENTION

1. Field of the Invention

The present invention relates to a multilayer substrate including a coil conductor and a method for manufacturing the multilayer substrate.

2. Description of the Related Art

As an example of a multilayer substrate including a coil conductor, there is a multilayer substrate in which a plurality of insulating base materials having thermoplasticity are laminated, and a plurality of coil conductors are patterned on a laminated interface, a mounting surface, and the like of the insulating base materials. Conventionally, in a configuration in which coil conductors are formed on a plurality of different surfaces, such as the laminated interface and the mounting surface in a state in which the coil conductors are arranged in a lamination direction of the insulating base materials, typically the coil conductors adjacent to each other in the lamination direction are directly connected with each other via an interlayer connection conductor (for example, WO 2015/152333). After the coil conductors and external electrodes are formed on the plurality of insulating base materials, the insulating base materials are laminated and collectively hot pressed, thus manufacturing the multilayer substrate.

In recent years, thinning of the insulating base material is proceeding with miniaturization and reduction of the height of the multilayer substrate. Consequently, when the hot pressing is performed in a process of manufacturing the multilayer substrate, an electrical short circuit occurs between the coil conductors adjacent to each other in the lamination direction at a point susceptible to heat and a point in which the insulating base material is particularly thin.

However, in the conventional multilayer substrate, since the coil conductors adjacent to each other in the lamination direction are directly connected with each other, even when the electrical short circuit occurs between the coil conductors, there is only a small change in the inductance induced between two external electrodes from a predetermined value in the case that the short circuit does not occur between the coil conductors. For this reason, it is sometimes difficult to determine whether the short circuit occurs, based on a measurement value of the inductance between the two external electrodes.

SUMMARY OF THE INVENTION

Preferred embodiments of the present invention provide multilayer substrates capable of accurately detecting the electrical short circuit established between the coil conductors.

A multilayer substrate according to a preferred embodiment of the present invention includes a laminated body, a first external electrode, a second external electrode, and a plurality of coil conductors. The laminated body includes a plurality of insulating base materials having thermoplasticity that are laminated together, and includes a first main surface and a second main surface that are located opposite each other in a lamination direction of the insulating base materials. The first external electrode and the second external electrode are provided on the first main surface. The plurality of coil conductors include at least three coil conductors that are respectively patterned on a plurality of different surfaces of the first main surface, the second main surface, and laminated interfaces of the insulating base materials and that are arranged in the lamination direction. The plurality of coil conductors include a first coil conductor and a second coil conductor, and are connected in series between the first external electrode and the second external electrode. A surface at which another coil conductor is provided is not interposed between two surfaces at which the first coil conductor and the second coil conductor are provided, respectively. The first coil conductor and the second coil conductor are directly connected to the first external electrode and the second external electrode, respectively, without another coil conductor therebetween.

According to the above multilayer substrate, in an electrical path of a circuit provided in the multilayer substrate, the first coil conductor is closest to the first external electrode, and the second coil conductor is closest to the second external electrode. Thus, when an electrical short circuit occurs between the first coil conductor and the second coil conductor, an amount of change in the inductance induced between the first external electrode and the second external electrode based on a predetermined value in the case that no short circuit occurs is increased. Thus, a determination whether the short circuit occurs is able to be made based on a measurement value of the inductance between the first external electrode and the second external electrode. This enables a defective product to be distinguished in a characteristic inspection step after manufacturing of the multilayer substrate.

In a multilayer substrate according to a preferred embodiment of the present invention, preferably one of the two surfaces at which the first coil conductor and the second coil conductor are respectively provided is a surface having the smallest distance to the first main surface or the second main surface in the lamination direction among the plurality of different surfaces or a surface having the distance of zero and coinciding with the first main surface or the second main surface.

According to this configuration, the two coil conductors in which the electrical short circuit easily occurs among the plurality of coil conductors are directly connected to the first external electrode and the second external electrode, respectively, as the first coil conductor and the second coil conductor.

In a multilayer substrate according to a preferred embodiment of the present invention, the laminated body includes two regions. A first region is defined by a distance from the first main surface in the lamination direction to the surface at which the coil conductor that is second from the first main surface is provided. A second region is defined by a distance from the second main surface in the lamination direction to the surface at which the coil conductor that is second from the second main surface is provided. Preferably the two coil conductors located in the region having the smaller distance are directly connected to the first external electrode and the second external electrode, respectively, as the first coil conductor and the second coil conductor without another coil conductor interposed therebetween.

According to this configuration, among the plurality of coil conductors, the two coil conductors in which the electrical short circuit easily occurs particularly during hot pressing in a manufacturing process are directly connected to the first external electrode and the second external electrode, respectively, to define the first coil conductor and the second coil conductor.

In a multilayer substrate according to a preferred embodiment of the present invention, assuming that the coil conductor provided on the surface having the largest distance from the one surface in the lamination direction among the plurality of different surfaces is a third coil conductor, preferably the plurality of coil conductors have the following connection relationship. That is, preferably a connection path from the first coil conductor to the third coil conductor reaches the third coil conductor without returning on the way to the surface at which the first coil conductor is provided. Preferably a connection path from the third coil conductor to the second coil conductor reaches the second coil conductor without returning on the way to the surface at which the third coil conductor is provided.

According to this configuration, the connection path from the first coil conductor to the second coil conductor is shortened, and therefore, an electrical resistance occurring between the first external electrode and the second external electrode decreases.

In a multilayer substrate according to a preferred embodiment of the present invention, the one surface may be a surface having the smallest distance to the first main surface in the lamination direction or a surface having the distance of zero and coinciding with the first main surface. In this configuration, preferably, one of the first external electrode and the second external electrode and one of the first coil conductor and the second coil conductor are directly connected with each other without passing through other surfaces that are not the surface at which the one coil conductor is provided from among the plurality of different surfaces. Preferably, another one of the first external electrode and the second external electrode and another one of the first coil conductor and the second coil conductor are directly connected with each other without passing through other surfaces that are not the two surfaces where the first coil conductor and the second coil conductor are respectively formed from among the plurality of difference surfaces.

According to this configuration, the connection path from the first external electrode to the second external electrode is shortened, and therefore the electrical resistance occurring between the first external electrode and the second external electrode is further decreased.

In a multilayer substrate according to a preferred embodiment of the present invention, preferably the distance between the surface at which the first coil conductor is provided and the surface at which the second coil conductor is provided in the lamination direction is smaller than the distance between the surfaces at which other coil conductors are provided.

According to this configuration, the two coil conductors in which the electrical short circuit easily occurs among the plurality of coil conductors are directly connected to the first external electrode and the second external electrode, respectively, as the first coil conductor and the second coil conductor.

A method for manufacturing the multilayer substrate according to a preferred embodiment of the present invention includes a conductor forming step and a laminating step. The conductor forming step is a step of forming, on a plurality of insulating base materials having thermoplasticity, a plurality of coil conductors, a first external electrode, a second external electrode, and a wiring conductor, wherein the plurality of coil conductors include at least three coil conductors including a first coil conductor and a second coil conductor. The laminating step is a step of laminating the plurality of insulating base materials to form a laminated body including a first main surface and a second main surface that are located opposite each other in a lamination direction of the insulating base materials.

The conductor forming step includes the following three steps. The first step is a step of forming the first external electrode and the second external electrode on an insulating base material defining the first main surface. The second step is a step of forming the plurality of coil conductors respectively on the insulating base materials defining a plurality of different surfaces of the first main surface, the second main surface, and laminated interfaces of the insulating base materials. The third step is a step of forming a wiring conductor on the plurality of insulating base materials such that the first coil conductor and the second coil conductor are directly connected to the first external electrode and the second external electrode, respectively, without another coil conductor being interposed therebetween while the plurality of coil conductors are connected in series between the first external electrode and the second external electrode in the laminated body.

The laminating step includes a step of laminating the plurality of insulating base materials to collectively hot press the plurality of insulating base materials in the laminated body to be formed, such that the plurality of coil conductors are arranged in the lamination direction, and such that a surface at which another coil conductor is disposed is not interposed between two surfaces where the first coil conductor and the second coil conductor are disposed, respectively.

According to the above-described method for manufacturing the multilayer substrate, the multilayer substrate is able to be manufactured.

With multilayer substrates according to preferred embodiments of the present invention, the electrical short circuit established between the coil conductors is able to be accurately detected.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be described with reference to the drawings.

First Preferred Embodiment

Figure 1:
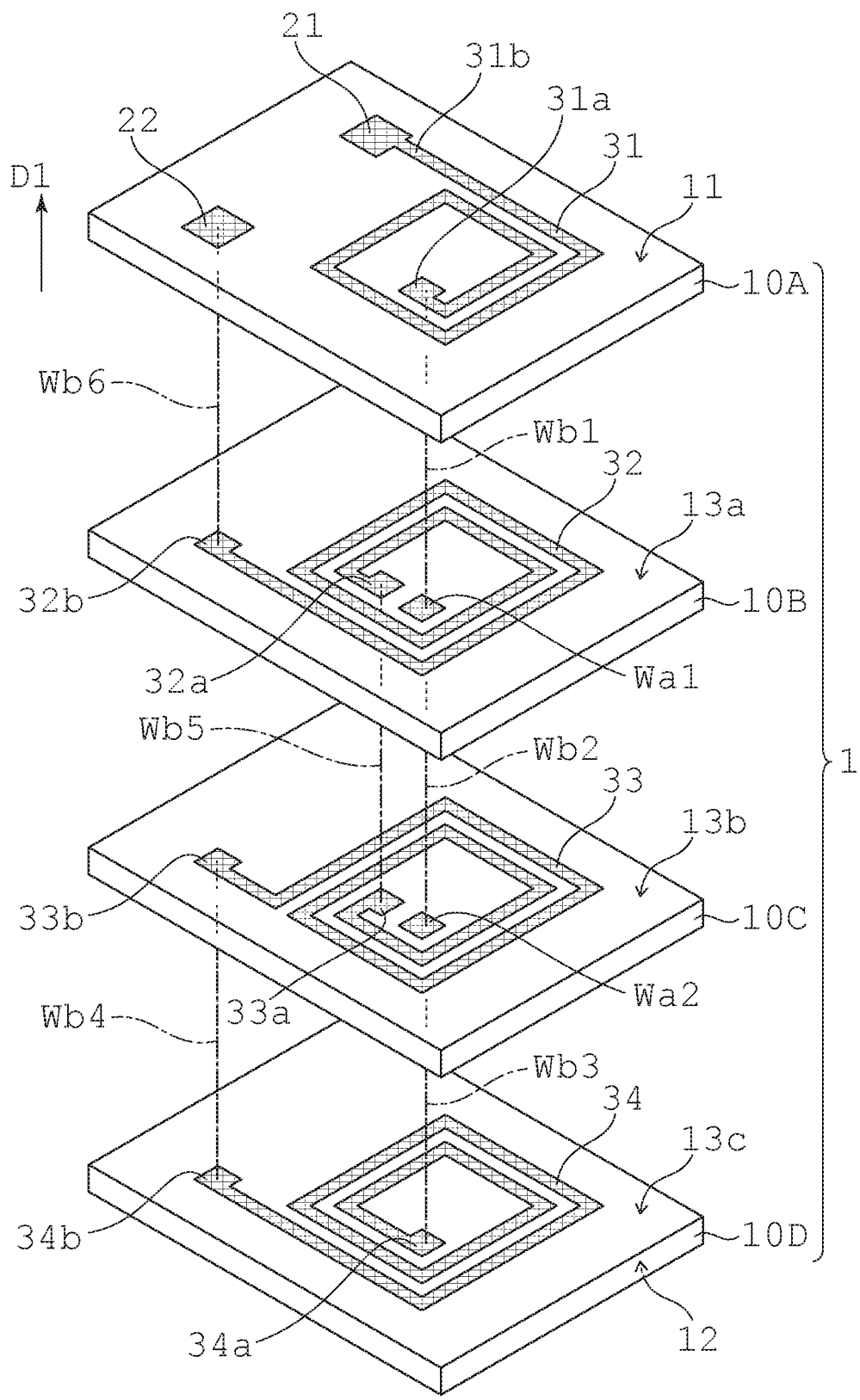
FIG. 1 is an exploded perspective view conceptually illustrating a multilayer substrate according to a first preferred embodiment of the present invention.

FIG. 1 is an exploded perspective view conceptually illustrating a multilayer substrate according to a first preferred embodiment of the present invention. As illustrated in FIG. 1, the multilayer substrate includes a laminated body 1, a first external electrode 21, a second external electrode 22, four coil conductors 31 to 34, and a wiring conductor.

As illustrated in FIG. 1, the laminated body 1 includes four insulating base materials 10A to 10D having thermoplasticity that are laminated together. In the present preferred embodiment, preferably, each of the insulating base materials 10A to 10D, which is made of a thermoplastic resin such as a liquid crystal polymer or a thermoplastic polyimide, for example, has a rectangular or substantially rectangular shape, and has the same or substantially the same size. The laminated body 1 includes a first main surface 11 and a second main surface 12, which are located on opposite sides to each other in a lamination direction D1 of the insulating base materials 10A to 10D. The insulating base materials 10A to 10D are not limited to the rectangular or substantially rectangular shape, and may have various shapes, such as a square or substantially square shape, for example.

Both of the first external electrode 21 and the second external electrode 22 are provided in the first main surface 11 of the laminated body 1. Specifically, the first external electrode and the second external electrode 22 are input and output electrodes, and are patterned in the surface of the insulating base material 10A defining the first main surface 11.

The coil conductors 31 to 34 are provided in the laminated body 1 in the following manner. That is, the coil conductor 31 is patterned in the first main surface 11, the coil conductor 32 is patterned in a laminated interface 13a between the insulating base materials 10A, 10B, and the coil conductor 33 is patterned in a laminated interface 13b between the insulating base materials 10B, 10C, and the coil conductor 34 is patterned in a laminated interface 13c between the insulating base materials 10C, 10D. In other words, the four coil conductors 31 to 34 are patterned in four different surfaces of the first main surface 11, the second main surface 12 (laminated interface 13c), and the laminated interfaces 13a and 13b, respectively. A protective film protecting the coil conductor 31 may be provided on the first main surface 11.

In the present preferred embodiment, the coil conductor 31 is provided on the surface of the insulating base material 10A defining the first main surface 11, and the coil conductors 32 to 34 are provided on the surfaces, on the side of the first main surface 11, of the insulating base materials 10B to 10D. At this point, the surfaces, on the side of the first main surface 11, of the insulating base materials 10B to 10D are surfaces defining the laminated interfaces 13a to 13c in the laminated body 1, respectively.

The coil conductors 31 to 34 are aligned or substantially aligned in the lamination direction D1. That is, the coil conductors 31 to 34 are arranged such that coil axes of the coil conductors 31 to 34 are coaxial or substantially coaxial. In other words, the coil conductors 31 to 34 are arranged such that openings of the coil conductors 31 to 34 oppose each other in the lamination direction D1. More specifically, the coil conductors 31 to 34 are structured such that projection images of the coil conductors 31 to 34 onto the first main surface 11 at least partially overlap each other around the coil axes. That is, the coil conductors 31 to 34 are arranged so as to be at least partially opposed to each other. The arrangement of the coil conductors 31 to 34 is not limited to the first preferred embodiment, but various modifications may be made. For example, the coil conductors 31 to 34 may be arranged so as to deviate from positions that oppose each other. For example, the coil conductors 31 to 34 are arranged such that the projection images of the coil conductors 31 to 34 onto the first main surface 11 are close to each other.

In the present preferred embodiment, each of the coil conductors 31 to 34 preferably includes a combination of a plurality of linear patterns such that shapes of the coil conductors 31 to 34 are quadrangular or substantially quadrangular spiral shapes, for example. When viewed from the side of the first main surface 11, each of the coil conductors 31 to 34 extends around the coil axis in the following manner. That is, the coil conductors 31, 33 respectively extend in a left-handed direction, that is, counterclockwise from inner peripheral ends 31a, 33a located on the inside to outer peripheral ends 31b, 33b located on the outside. On the other hand, the coil conductors 32, 34 respectively extend in a right-handed direction, that is, clockwise from inner peripheral ends 32a, 34a located on the inside to outer peripheral ends 32b, 34b located on the outside.

The coil conductors 31 to 34 may be constructed with a curved pattern or a combination of a linear pattern and a curved pattern. The coil conductors 31 to 34 may extend in the right-handed direction, that is, clockwise from the inside to the outside, or may extend in the left-handed direction, that is, counterclockwise from the inside to the outside.

In addition, the coil conductors 31 to 34 are structured such that the inner peripheral ends and the outer peripheral ends of the coil conductors 31 to 34 have the following positional relationship. That is, the outer peripheral end 32b of the coil conductor 32 is opposed to the second external electrode 22. The inner peripheral end 32a of the coil conductor 32 and the inner peripheral end 33a of the coil conductor 33 oppose each other. The outer peripheral end 33b of the coil conductor 33 and the outer peripheral end 34b of the coil conductor 34 oppose each other.

Further, in the surface, on the side of the first main surface 11, of the insulating base material 10B, an auxiliary conductor Wa1 for connection is provided at a position inside the coil conductor 32 and at a position separated from the coil conductor 32. In the surface, on the side of the first main surface 11, of the insulating base material 10C, an auxiliary conductor Wa2 is opposed to the auxiliary conductor Wa1. In the present preferred embodiment, the position of the auxiliary conductor Wa2 is a position inside the coil conductor 33 and a position separated from the coil conductor 33. The inner peripheral end 31a of the coil conductor 31 and the inner peripheral end 34a of the coil conductor 34 oppose each other while the auxiliary conductors Wa1, Wa2 are interposed between the inner peripheral end 31a and the inner peripheral end 34a.

The coil conductors 31 to 34 are connected in series between the first external electrode 21 and the second external electrode 22 by wiring conductors. Specifically, the coil conductors 31 to 34 are connected in the following manner such that current passes through the coil conductors 31 to 34 in the identical direction (that is, such that generated magnetic fields are intensified) when current passes between the first external electrode 21 and the second external electrode 22.

In the first main surface 11, the outer peripheral end 31b of the coil conductor 31 is directly connected to the first external electrode 21. That is, the outer peripheral end 31b of the coil conductor 31 is directly connected to the first external electrode 21 without the coil conductors 32 to 34 interposed therebetween.

The wiring conductor includes the auxiliary conductors Wa1, Wa2 and interlayer connection conductors Wb1 to Wb6 (to be described below). The interlayer connection conductors Wb1 to Wb6 are indicated by alternate long and short dash lines in FIG. 1.

The interlayer connection conductors Wb1 to Wb3 are conductive vias provided in the insulating base materials 10A to 10C, respectively, and are linearly arranged from the inner peripheral end 31a of the coil conductor 31 to the inner peripheral end 34a of the coil conductor 34. The interlayer connection conductor Wb1 connects the inner peripheral end 31a of the coil conductor 31 with the auxiliary conductor Wa1, the interlayer connection conductor Wb2 connects the auxiliary conductor Wa1 with the auxiliary conductor Wa2, and the interlayer connection conductor Wb3 connects the auxiliary conductor Wa2 with the inner peripheral end 34a of the coil conductor 34. Consequently, the inner peripheral end 31a of the coil conductor 31 and the inner peripheral end 34a of the coil conductor 34 are connected with each other without the coil conductors 32, 33 interposed therebetween.

The interlayer connection conductor Wb4 is a conductive via provided in the insulating base material 10C, and connects the outer peripheral end 34b of the coil conductor 34 with the outer peripheral end 33b of the coil conductor 33. The interlayer connection conductor Wb5 is a conductive via provided in the insulating base material 10B, and connects the inner peripheral end 33a of the coil conductor 33 with the inner peripheral end 32a of the coil conductor 32.

The interlayer connection conductor Wb6 is a conductive via provided in the insulating base material 10A, and connects the outer peripheral end 32b of the coil conductor 32 with the second external electrode 22. Consequently, the outer peripheral end 32b of the coil conductor 32 is directly connected to the second external electrode 22 without the coil conductors 31, 33, 34 interposed therebetween.

For example, each of the coil conductors 31 to 34, the first external electrode 21, the second external electrode 22, and the auxiliary conductors Wa1, Wa2 is preferably made of metal foil, such as copper foil. For example, the interlayer connection conductors Wb1 to Wb6 are conductors in which conductive paste filled in holes provided in the insulating base materials 10A to 10C are solidified (metallized).

Figure 2A:
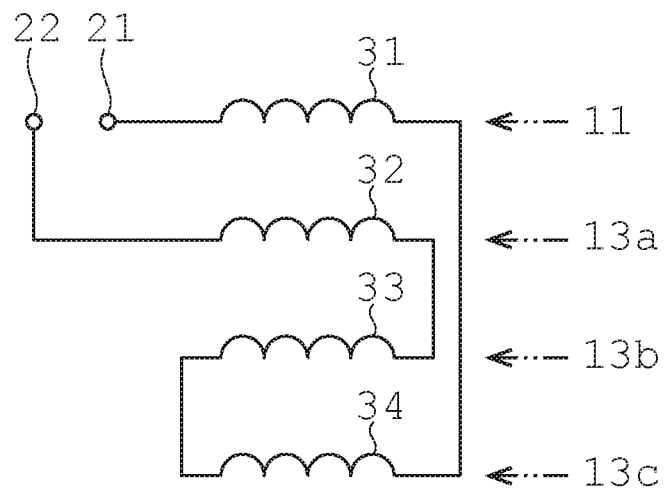
FIG. 2A is a diagram illustrating a circuit constructed on the multilayer substrate of the first preferred embodiment of the present invention.

In such wiring, a circuit in which the coil conductors 31 to 34 are connected in series between the first external electrode 21 and the second external electrode 22 is provided as illustrated in FIG. 2A. Specifically, the coil conductors 31 to 34 are connected in series in the order of the coil conductors 31, the coil conductors 34, the coil conductors 33, and the coil conductors 32 from the side closer to the first external electrode 21 in an electrical path of the circuit. In the present circuit, the coil conductors 31 to 34 may be used as a high-frequency coil or a low-frequency coil.

According to such the connection relationship, the coil conductors 31, 32 are directly connected to the first external electrode 21 and the second external electrode 22, respectively, without another coil conductor interposed therebetween. In the present preferred embodiment, the coil conductors 31, 32 are preferably two coil conductors, for example, that are adjacent to each other with the insulating base material 10A interposed therebetween, so that another coil conductor is not interposed between the coil conductors 31, 32 in the lamination direction D1.

When the coil conductor 31 directly connected to the first external electrode 21 without another coil conductor interposed therebetween is a "first coil conductor", and the coil conductor 32 directly connected to the second external electrode 22 without another coil conductor interposed therebetween is "a second coil conductor", the multilayer substrate has the following configuration. That is, the configuration is one such that a surface at which another coil conductor is provided is not interposed between the two surfaces at which the first coil conductor and the second coil conductor are provided, respectively. In the present preferred embodiment, the insulating base materials 10A, 10B in which the first coil conductor and the second coil conductor are provided, respectively are adjacent to each other without another insulating base material interposed therebetween.

The wiring conductor is not limited to the above-described configuration (such as the conductive via) as long as the wiring conductor is able to connect the coil conductors 31 to 34 in the connection relationship shown in FIG. 2A, and various modifications may be made.

Figure 3:
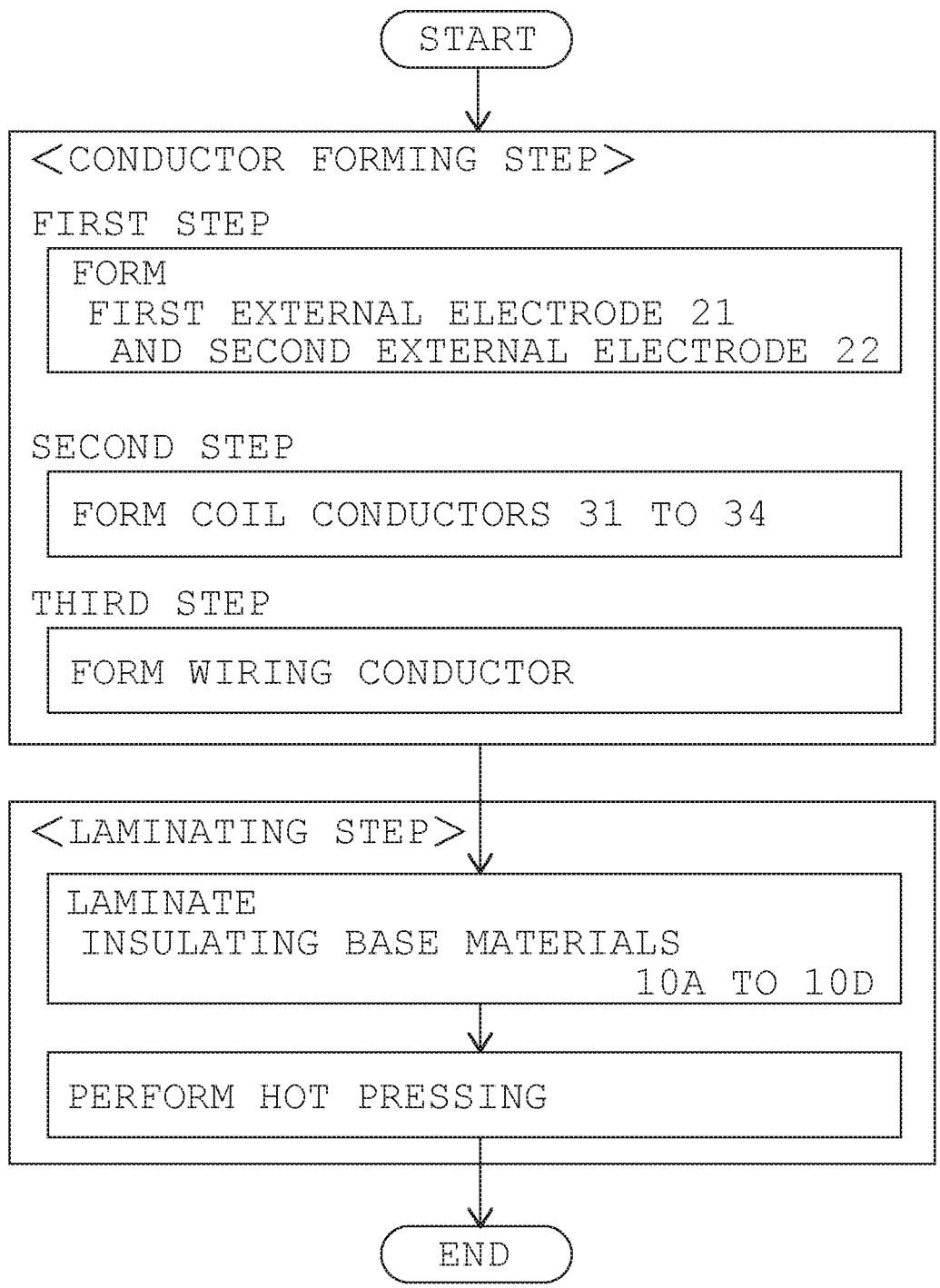
FIG. 3 is a flowchart illustrating a method for manufacturing the multilayer substrate.

Next, a non-limiting example of a method for manufacturing a multilayer substrate according to a preferred embodiment of the present invention will be described below with reference to FIGS. 1 and 3. The method for manufacturing the multilayer substrate includes at least a conductor forming step and a laminating step.

In the conductor forming step, the coil conductors 31 to 34, the first external electrode 21, the second external electrode 22, and the wiring conductors are formed in the insulating base materials 10A to 10D by performing first to third steps.

Herein, the first step is a step of forming the first external electrode 21 and the second external electrode 22. The second step is a step of forming the coil conductors 31 to 34. The third step is a step of forming a wiring conductor. The first to third steps may be performed individually, or several steps of the first to third steps may be performed collectively as described below.

The coil conductor 31, the first external electrode 21, the second external electrode 22, and the interlayer connection conductors Wb1, Wb6 are formed in the insulating base material 10A. Specifically, the coil conductor 31, the first external electrode 21, and the second external electrode 22 are formed, by patterning or other suitable method, in the surface of the insulating base material 10A defining the first main surface 11. More specifically, the coil conductor 31, the first external electrode 21, and the second external electrode 22 are formed by performing patterning, such as photolithography on metal foil, such as copper foil, for example, which is formed over one surface of the insulating base material 10A. The same holds true for the formation of the coil conductors 32 to 34 and the auxiliary conductors Wa1, Wa2, which will be described below.

Also, the interlayer connection conductors Wb1, Wb6 are formed so as to penetrate the insulating base material 10A at respective positions of the inner peripheral end 31a of the coil conductor 31 and the second external electrode 22. Specifically, at the positions at which the interlayer connection conductors Wb1, Wb6 should be formed, holes that penetrate the insulating base material 10A are made in the insulating base material 10A. At this point, the holes are made so as not to penetrate through the coil conductor 31 and the second external electrode 22, which are formed in the surface of the insulating base material 10A. Then, the interlayer connection conductors Wb1, Wb6 are formed by filling the holes with the conductive paste. The same holds true for the formation of the interlayer connection conductors Wb2 to Wb5 to be described below.

The coil conductor 32, the auxiliary conductor Wa1, and the interlayer connection conductors Wb2, Wb5 are formed in the insulating base material 10B. Specifically, the coil conductor 32 and the auxiliary conductor Wa1 are formed, by patterning or other suitable method, in the surface of the insulating base material 10B defining the surface on the side of the first main surface 11. At this point, the outer peripheral end 32b of the coil conductor is formed at the position opposed to the second external electrode 22 during the lamination, and the auxiliary conductor Wa1 is formed at the position opposed to the inner peripheral end 31a of the coil conductor 31 during the lamination. Also, the interlayer connection conductors Wb2, Wb5 are formed so as to penetrate the insulating base material 10B at respective positions of the auxiliary conductor Wa1 and the inner peripheral end 32a of the coil conductor 32.

The coil conductor 33, the auxiliary conductor Wa2, and the interlayer connection conductors Wb3, Wb4 are formed in the insulating base material 10C. Specifically, the coil conductor 33 and the auxiliary conductor Wa2 are formed, by patterning or other suitable method, in the surface of the insulating base material 10C defining the surface on the side of the first main surface 11. At this point, the inner peripheral end 33a of the coil conductor 33 is formed at the position opposed to the inner peripheral end 32a of the coil conductor 32 during the lamination, and the auxiliary conductor Wa2 is formed at the position opposed to the auxiliary conductor Wa1 during the lamination. Also, the interlayer connection conductors Wb3, Wb4 are formed so as to penetrate the insulating base material 10C at respective positions of the auxiliary conductor Wa2 and the outer peripheral end 33b of the coil conductor 33.

The coil conductor 34 is formed in the insulating base material 10D. Specifically, the coil conductor 34 is formed, by patterning or other suitable method, in the surface of the insulating base material 10D defining the surface on the side of the first main surface 11. At this point, the inner peripheral end 34a of the coil conductor 34 is formed at the position opposed to the auxiliary conductor Wa2 during the lamination, and the outer peripheral end 34b of the coil conductor 34 is formed at the position opposed to the outer peripheral end 33b of the coil conductor 33 during the lamination.

In the laminating step, the insulating base materials 10A to 10D are laminated while arranged in this order, and then the insulating base materials 10A to 10D are collectively hot pressed. By the hot pressing, the insulating base materials 10A to 10D are crimped against each other and the interlayer connection conductors Wb1 to Wb6 are solidified (metallized). Consequently, the laminated body 1 is formed. After the formation of the laminated body 1, the protective film protecting the coil conductor 31 may be formed on the first main surface 11.

Through the conductor forming step and the laminating step, the coil conductors 31 to 34 are connected in series between the first external electrode 21 and the second external electrode 22, and the coil conductors 31, 32 are directly connected to the first external electrode 21 and the second external electrode 22, respectively, without another coil conductor interposed therebetween. Consequently, the coil conductors 31, 32 define the first coil conductor and the second coil conductor, respectively, and the surface at which another coil conductor is formed is not interposed between the two surfaces on which the first coil conductor and the second coil conductor are formed, respectively.

During the hot pressing in the laminating step, the insulating base material 10A defining the first main surface 11 and the insulating base material 10D defining the second main surface 12 are most easily affected by heat. That is, during the hot pressing, pressure is applied to the insulating base materials 10A to 10D from metal molds disposed above and below in the lamination direction D1, and heat is also applied to the insulating base materials 10A to 10D. At this point, the heat is easily transferred to the insulating base materials 10A, 10D located closest to the upper and lower metal molds, and the heat is transferred to a lesser extent to the insulating base materials 10C, 10D located inside away from the metal molds. Deformation or resin flow tends to be generated in the insulating base material 10A made of a thermoplastic resin, so that a change of a relative positional relationship is mostly generated in the two coil conductors 31, 32 that are adjacent to each other with the insulating base material 10A interposed therebetween. As a result, in the multilayer substrate, the electrical short circuit tends to occur between the two coil conductors 31, 32 which are adjacent to each other while the insulating base material 10A susceptible to the heat is interposed therebetween.

In other words, the coil conductors 31, 32 satisfy the following condition among combinations constructed by selecting two of the coil conductors 31 to 34. That is, the condition is one that the coil conductors are adjacent to each other without another coil conductor interposed therebetween in the lamination direction D1, and is one that one of the adjacent coil conductors is located closest to the metal mold among the coil conductors 31 to 34. As described above, in the two coil conductors satisfying the condition, the change of the relative positional relationship is most easily generated due to the deformation or the resin flow of the insulating base material interposed between the two coil conductors. Thus, the electrical short circuit easily occurs between the coil conductors 31, 32 satisfying the condition.

In the multilayer substrate of the first preferred embodiment, the two coil conductors 31, 32 in which the electrical short circuit easily occurs are directly connected to the first external electrode 21 and the second external electrode 22, respectively, as the first coil conductor and the second coil conductor without other coil conductors interposed therebetween. That is, as illustrated in FIG. 2A, in the electrical path of the circuit provided on the multilayer substrate, the coil conductor 31 is closest to the first external electrode 21, and the coil conductor 32 is closest to the second external electrode 22.

Figure 4A:
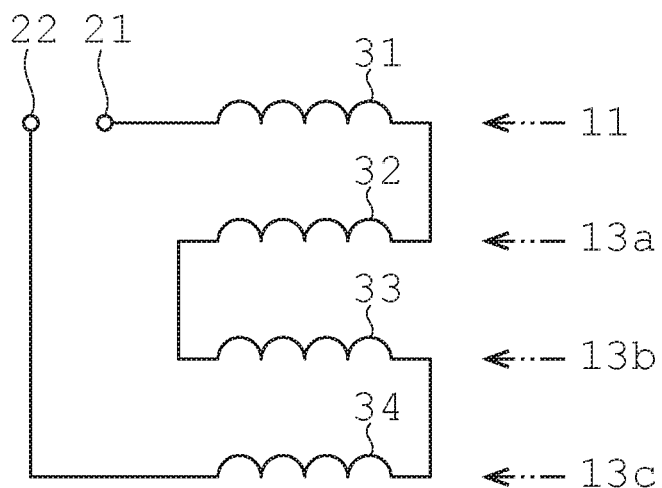
FIG. 4A is a diagram illustrating a circuit constructed on a multilayer substrate according to a comparative example.

A circuit in FIG. 4A is provided as a comparative example. In the circuit of FIG. 4A, the coil conductors 31 to 34 are connected in series in the order of the coil conductor 31, the coil conductor 32, the coil conductor 33, and the coil conductor 34 from the side closer to the first external electrode 21 in the electrical path.

Figure 4B:
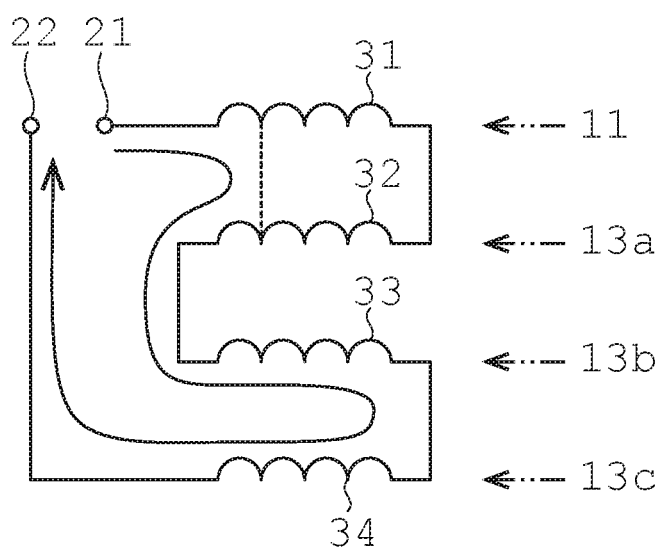
FIG. 4B is a diagram illustrating the state in which the electrical short circuit is established in the circuit.

According to the comparative example, as illustrated in FIG. 4B, even if the electrical short circuit (indicated by a broken line) is established between the coil conductors 31, 32, only a small change is generated in inductance L induced between the first external electrode 21 and the second external electrode 22 based on a predetermined value L0 in the case that no short circuit occurs. Specifically, the predetermined value L0 is expressed by L0=L1+L2+L3+L4 using inductances L1 to L4 of the coil conductors 31 to 34. And, when the electrical short circuit is established between the coil conductors 31, 32, the inductance L is expressed by L=L1' (a portion of L1)+L2' (a portion of L2)+L3+L4. For this reason, it is difficult to determine whether the short circuit occurs, based on a measurement value of the inductance L between the first external electrode 21 and the second external electrode 22.

Figure 2B:
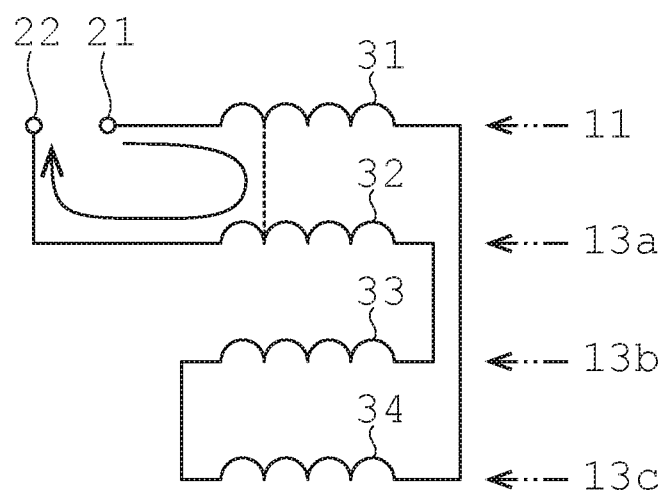
FIG. 2B is a diagram illustrating a state where an electrical short circuit is established in the circuit.

On the other hand, according to the multilayer substrate of the first preferred embodiment, as illustrated in FIG. 2B, when the electrical short circuit (illustrated by a broken line) is established between the coil conductors 31, 32, an amount of change in the inductance L induced between the first external electrode 21 and the second external electrode 22 based on the predetermined value L0 in the case that no short circuit occurs is increased. That is, the inductance L is a value represented by L=L1'+L2'.

Thus, the determination whether the short circuit occurs is able to be made based on the measurement value of the inductance L between the first external electrode 21 and the second external electrode 22. That is, the electrical short circuit established between the coil conductors 31, 32 is able to be accurately detected in the multilayer substrate of the first preferred embodiment. This enables a defective product to be distinguished in a characteristic inspection step after manufacturing of the multilayer substrate.

Second Preferred Embodiment

Figure 5:
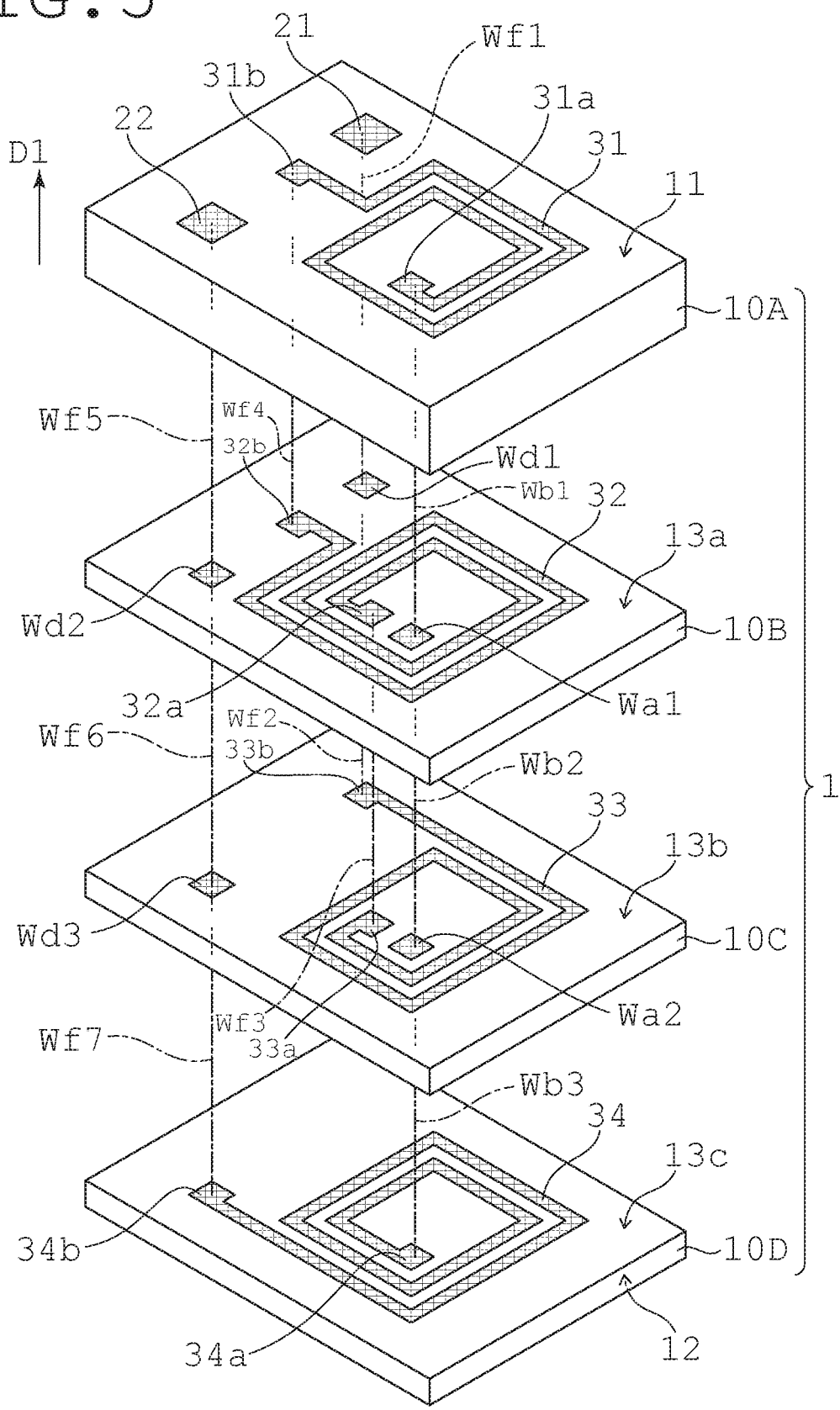
FIG. 5 is an exploded perspective view conceptually illustrating a multilayer substrate according to a second preferred embodiment of the present invention.

FIG. 5 is an exploded perspective view conceptually illustrating a multilayer substrate according to a second preferred embodiment of the present invention. As illustrated in FIG. 5, in the laminated body 1, the insulating base material 10A may preferably be larger than other insulating base materials 10B to 10D in thickness in the lamination direction D1.

The following two regions included in the laminated body 1 are considered in this configuration. That is, a first region is defined by a distance X1 from the first main surface 11 in the lamination direction D1 to the laminated interface (in this case, the laminated interface 13a) where the coil conductor (in this case, the coil conductor 32) that is second from the side of the first main surface 11 is provided. A second region is defined by a distance X2 from the second main surface 12 in the lamination direction D1 to the laminated interface (in this case, the laminated interface 13b) where the coil conductor (in this case, the coil conductor 33) that is second from the side of the second main surface 12 is provided.

When the distances X1 and X2 are compared to each other, preferably the two coil conductors located in the region in which the distance is smaller are directly connected to the first external electrode 21 and the second external electrode 22, respectively, as the first coil conductor and the second coil conductor without other coil conductors interposed therebetween.

The first preferred embodiment is an example of the case in which the distance X1 is preferably smaller than the distance X2 (see FIG. 1). On the other hand, when the distance X2 is smaller than the distance X1 as in the second preferred embodiment, the insulating base materials 10C, 10D located on the side of the second main surface 12 are easily affected by the heat during the hot pressing in the laminating step. For this reason, the electrical short circuit easily occurs between the two coil conductors 33, 34 that are adjacent to each other with the insulating base material 10C that is easily affected by the heat interposed therebetween.

Thus, in the multilayer substrate having such a configuration, preferably the two coil conductors 33, 34 in which the electrical short circuit easily occurs are directly connected to the first external electrode 21 and the second external electrode 22, respectively, as the first coil conductor and the second coil conductor without other coil conductors interposed therebetween. Also, in the present preferred embodiment, the insulating base material 10A is larger than other insulating base materials 10B to 10D in the thickness in the lamination direction D1. Consequently, even if the insulating base material 10A is deformed during the hot pressing, the electrical short circuit is unlikely to occur between the two coil conductors 31, 32 that are adjacent to each other with the insulating base material 10A interposed therebetween. That is, on the side of the first main surface 11, the electrical short circuit is unlikely to occur between the coil conductors 31, 32. The specific description will be made with reference to FIG. 5.

In the present preferred embodiment, the coil conductors 31 to 34 are structured such that the inner peripheral ends and the outer peripheral ends of the coil conductors 31 to 34 have the following positional relationships. That is, the outer peripheral end 31b of the coil conductor 31 is not directly connected to the first external electrode 21, and the outer peripheral end 31b of the coil conductor 31 and the outer peripheral end 32b of the coil conductor 32 are disposed at the positions opposed to each other. Also, the inner peripheral end 32a of the coil conductor 32 and the inner peripheral end 33a of the coil conductor 33 are provided at the positions opposed to each other. The outer peripheral end 33b of the coil conductor 33 is provided at the position opposed to the first external electrode 21. The outer peripheral end 34b of the coil conductor 34 is provided at the position opposed to the second external electrode 22.

Similarly to the first preferred embodiment, the auxiliary conductors Wa1, Wa2 for connection are further provided on the respective surfaces, on the side of the first main surface 11, of the insulating base materials 10B, 10C. In addition, the inner peripheral end 31a of the coil conductor 31 and the inner peripheral end 34a of the coil conductor 34 are provided at the positions opposed to each other while the auxiliary conductors Wa1, Wa2 are interposed between the inner peripheral end 31a and the inner peripheral end 34a.

The coil conductors 31 to 34 are connected in series between the first external electrode 21 and the second external electrode 22 by wiring conductors. Specifically, in the present preferred embodiment, the coil conductors 31 to 34 are connected in the following manner such that current passes through the coil conductors 31 to 34 in the identical direction (that is, such that generated magnetic fields are intensified) when current is passed between the first external electrode 21 and the second external electrode 22.

The wiring conductor includes the auxiliary conductors Wa1, Wa2, auxiliary conductors Wd1 to Wd3 for connection (to be described below), and interlayer connection conductors Wb1 to Wb3, Wf1 to Wf7 (to be described below). The interlayer connection conductors Wb1 to Wb3, Wf1 to Wf7 are indicated by alternate long and short dash lines in FIG. 5.

The auxiliary conductor Wd1 is provided at the position opposed to the first external electrode 21 in the surface, on the side of the first main surface 11, of the insulating base material 10B. The auxiliary conductors Wd2, Wd3 are provided at the positions opposed to the second external electrode 22 in the respective surfaces, on the side of the first main surface 11, of the insulating base materials 10B, 10C.

The interlayer connection conductors Wf1, Wf2 are conductive vias provided in the insulating base materials 10A, 10B, respectively, and are linearly arranged from the first external electrode 21 to the outer peripheral end 33b of the coil conductor 33. The interlayer connection conductor Wf1 connects the first external electrode 21 with the auxiliary conductor Wd1. The interlayer connection conductor Wf2 connects the auxiliary conductor Wd1 with the outer peripheral end 33b of the coil conductor 33. Consequently, the outer peripheral end 33b of the coil conductor 33 is directly connected to the first external electrode 21 without the coil conductors 31, 32, 34 interposed therebetween.

The interlayer connection conductor Wf3 is a conductive via provided in the insulating base material 10B, and connects the inner peripheral end 33a of the coil conductor 33 with the inner peripheral end 32a of the coil conductor 32. The interlayer connection conductor Wf4 is a conductive via provided in the insulating base material 10A, and connects the outer peripheral end 32b of the coil conductor 32 with the outer peripheral end 31b of the coil conductor 31.

Similarly to the first preferred embodiment, the interlayer connection conductors Wb1 to Wb3 are conductive vias provided in the insulating base materials 10A to 10C, respectively, and are linearly arranged from the inner peripheral end 31a of the coil conductor 31 to the inner peripheral end 34a of the coil conductor 34. In addition, the interlayer connection conductor Wb1 connects the inner peripheral end 31a of the coil conductor 31 with the auxiliary conductor Wa1, the interlayer connection conductor Wb2 connects the auxiliary conductor Wa1 with the auxiliary conductor Wa2, and the interlayer connection conductor Wb3 connects the auxiliary conductor Wa2 with the inner peripheral end 34a of the coil conductor 34. Consequently, the inner peripheral end 31a of the coil conductor 31 and the inner peripheral end 34a of the coil conductor 34 are connected with each other without the coil conductors 32, 33 interposed therebetween.

The interlayer connection conductors Wf5 to Wf7 are conductive vias provided in the insulating base materials 10A to 10C, respectively, and are linearly arranged from the second external electrode 22 to the outer peripheral end 34b of the coil conductor 34. In addition, the interlayer connection conductor Wf5 connects the second external electrode 22 with the auxiliary conductor Wd2. The interlayer connection conductor Wf6 connects the auxiliary conductor Wd2 with the auxiliary conductor Wd3. The interlayer connection conductor Wf7 connects the auxiliary conductor Wd3 with the outer peripheral end 34b of the coil conductor 34. Consequently, the outer peripheral end 34b of the coil conductor 34 is directly connected to the second external electrode 22 without the coil conductors 31 to 33 interposed therebetween.

Figure 6A:
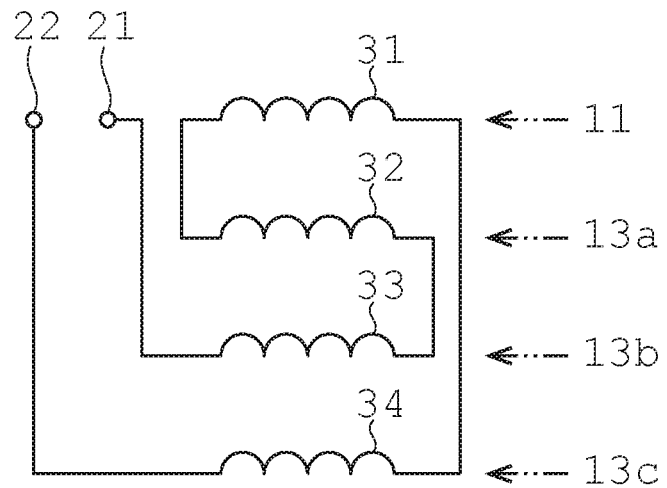
FIG. 6A is a diagram illustrating a circuit constructed on the multilayer substrate of the second preferred embodiment of the present invention.

In such wiring, as illustrated in FIG. 6A, a circuit is provided in which the coil conductors 31 to 34 are connected in series between the first external electrode 21 and the second external electrode 22. Specifically, the coil conductors 31 to 34 are connected in series in the order of the coil conductors 33, the coil conductors 32, the coil conductors 31, and the coil conductors 34 from the side closer to the first external electrode 21 in the electrical path of the circuit. In the circuit, the coil conductors 31 to 34 may be used as a high-frequency coil or a low-frequency coil.

According to such a connection relationship, the coil conductors 33, 34 are directly connected to the first external electrode 21 and the second external electrode 22, respectively, without other coil conductors interposed therebetween. That is, the two coil conductors 33, 34 in which the electrical short circuit easily occurs are directly connected to the first external electrode 21 and the second external electrode 22, respectively, as the first coil conductor and the second coil conductor.

Figure 6B:
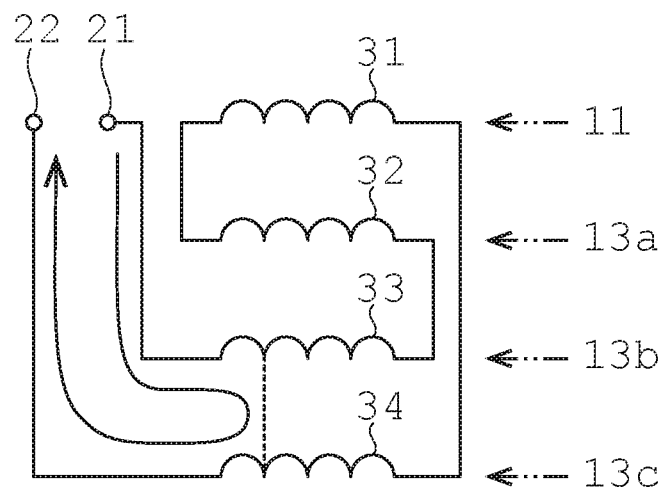
FIG. 6B is a diagram illustrating the state in which the electrical short circuit is established in the circuit.

Thus, as illustrated in FIG. 6B, when the electrical short circuit (illustrated by a broken line) is established between the coil conductors 33, 34, an amount of change in the inductance L induced between the first external electrode 21 and the second external electrode 22 based on the predetermined value L0 in the case that no short circuit occurs is increased. That is, the inductance L is a value represented by $L=L3'$ (a portion of L3)+$L4'$ (a portion of L4).

Thus, the determination whether the short circuit occurs is able to be made based on the measurement value of the inductance L between the first external electrode 21 and the second external electrode 22. That is, the electrical short circuit established between the coil conductors 33, 34 is able to be accurately detected in the multilayer substrate of the second preferred embodiment. This enables a defective product to be distinguished in a characteristic inspection step after manufacturing of the multilayer substrate.

Third Preferred Embodiment

In the first preferred embodiment, as illustrated in FIGS. 1 and 2A, the coil conductor 31 being the first one from the side of the first main surface 11 is directly connected to the first external electrode 21 as the first coil conductor without other coil conductors interposed therebetween. In addition, the coil conductor 32 being the second one from the side of the first main surface 11 is directly connected to the second external electrode 22 as the second coil conductor without other coil conductors interposed therebetween.

In the second preferred embodiment, as illustrated in FIGS. 5 and 6A, the coil conductor 34 being the first one from the side of the second main surface 12 is directly connected to the second external electrode 22 as the second coil conductor without other coil conductors interposed therebetween. The coil conductor 33 being the second one from the side of the second main surface 12 is directly connected to the first external electrode 21 as the first coil conductor without other coil conductors interposed therebetween.

In this manner, preferably the two coil conductors that are adjacent to each other in a region, on the surface layer side, of the laminated body 1 in the lamination direction D1 are directly connected to the first external electrodes 21 and the second external electrode 22, respectively, as the first coil conductor and the second coil conductor without other coil conductors interposed therebetween. At this point, the region, on the surface layer side, of the laminated body 1 in the lamination direction D1 is easily affected by the heat during the hot pressing in the laminating step. In addition, in the region, the electrical short circuit easily occurs between two coil conductors adjacent to each other. Thus, the two coil conductors arranged in the region are connected to define the first coil conductor and the second coil conductor, which allows the electrical short circuit to be accurately detected in the region.

In other words, preferably one of the two surfaces at which the first coil conductor and the second coil conductor are provided, respectively, is a surface having the smallest distance to the first main surface 11 or the second main surface 12 in the lamination direction D1 among the plurality of surfaces where the coil conductors are formed, or a surface having the distance of zero and coinciding with the first main surface 11 or the second main surface 12.

Fourth Preferred Embodiment

In the first preferred embodiment, as illustrated in FIGS. 1 and 2A, the laminated interface 13c is the surface at which the coil conductor 34 is provided and the surface having the largest distance, in the lamination direction D1, from the first main surface 11 in which the coil conductor 31 defining the first coil conductor is provided, among the surfaces at which the coil conductors 31 to 34 are provided. Assuming that the coil conductor provided in the laminated interface 13c is the third coil conductor, the connection relationship among the coil conductors 31 to 34 is as follows.

That is, a connection path (31→34) from the first coil conductor (coil conductor 31) to the third coil conductor (coil conductor 34) reaches the third coil conductor without returning on the way to the surface (first main surface 11) in which the first coil conductor is provided. A connection path (34→33→32) from the third coil conductor (coil conductor 34) to the second coil conductor (coil conductor 32) reaches the second coil conductor without returning on the way to the surface (laminated interface 13c) in which the third coil conductor is provided.

In the second preferred embodiment, as illustrated in FIGS. 5 and 6A, the first main surface 11 is the surface at which the coil conductor 31 is provided and the surface having the largest distance, in the lamination direction D1, from the laminated interface 13c in which the coil conductor 34 defining the second coil conductor is provided, among the surfaces at which the coil conductors 31 to 34 are provided. Assuming that the coil conductor 31 provided in the first main surface 11 is the third coil conductor, the connection relationship among the coil conductors 31 to 34 is as follows.

That is, a connection path (33→32→31) from the first coil conductor (coil conductor 33) to the third coil conductor (coil conductor 31) reaches the third coil conductor without returning on the way to the surface (laminated interface 13b) in which the first coil conductor is provided. The connection path (31→34) from the third coil conductor (coil conductor 31) to the second coil conductor (coil conductor 34) reaches the second coil conductor without returning on the way to the surface (first main surface 11) in which the third coil conductor is provided.

As described above, in the multilayer substrate, preferably the connection path from the first coil conductor to the third coil conductor reaches the third coil conductor without returning on the way to the surface at which the first coil conductor is provided. Preferably a connection path from the third coil conductor to the second coil conductor reaches the second coil conductor without returning on the way to the surface where the third coil conductor is provided.

In this configuration, the connection path from the first coil conductor to the second coil conductor is shortened, and therefore, an electrical resistance occurring between the first external electrode 21 and the second external electrode 22 decreases. Additionally, routing of the wiring in the multilayer substrate (in the first main surface 11, the second main surface 12, and the multilayer substrate) is simplified, and therefore a wiring space of the multilayer substrate may effectively be used for other wirings.

Fifth Preferred Embodiment

The multilayer substrate of the first preferred embodiment further has the following configuration in addition to the configuration described in the fourth preferred embodiment. That is, the first external electrode 21 and the coil conductor 31 that is the first coil conductor are directly connected with each other without the surfaces (laminated interfaces 13a to 13c) in which the coil conductors 32 to 34 other than the coil conductor are provided interposed therebetween. The second external electrode 22 and the coil conductor 32 that is the second coil conductor are directly connected with each other without the surfaces (laminated interfaces 13b, 13c) in which the coil conductors 33, 34 other than the coil conductors 31, 32 are provided interposed therebetween.

In this manner, in the multilayer substrate, preferably one of the first external electrode 21 and the second external electrode 22 and one of the first coil conductor and second coil conductor are directly connected with each other without other surfaces interposed therebetween except for, from among the surfaces at which the coil conductors 31 to 34 are provided, the surface at which the one coil conductor is provided. Preferably the other of the first external electrode 21 and the second external electrode 22 and the other of the first coil conductor and the second coil conductor are directly connected with each other without other surfaces interposed therebetween except for, from among the surfaces where the coil conductors 31 to 34 are provided, the two surfaces where the first coil conductor and the second coil conductor are provided, respectively.

In this configuration, the connection path from the first external electrode 21 to the second external electrode 22 is shortened, and therefore, the electrical resistance occurring between the first external electrode 21 and the second external electrode 22 is further decreased.

Figure 7:
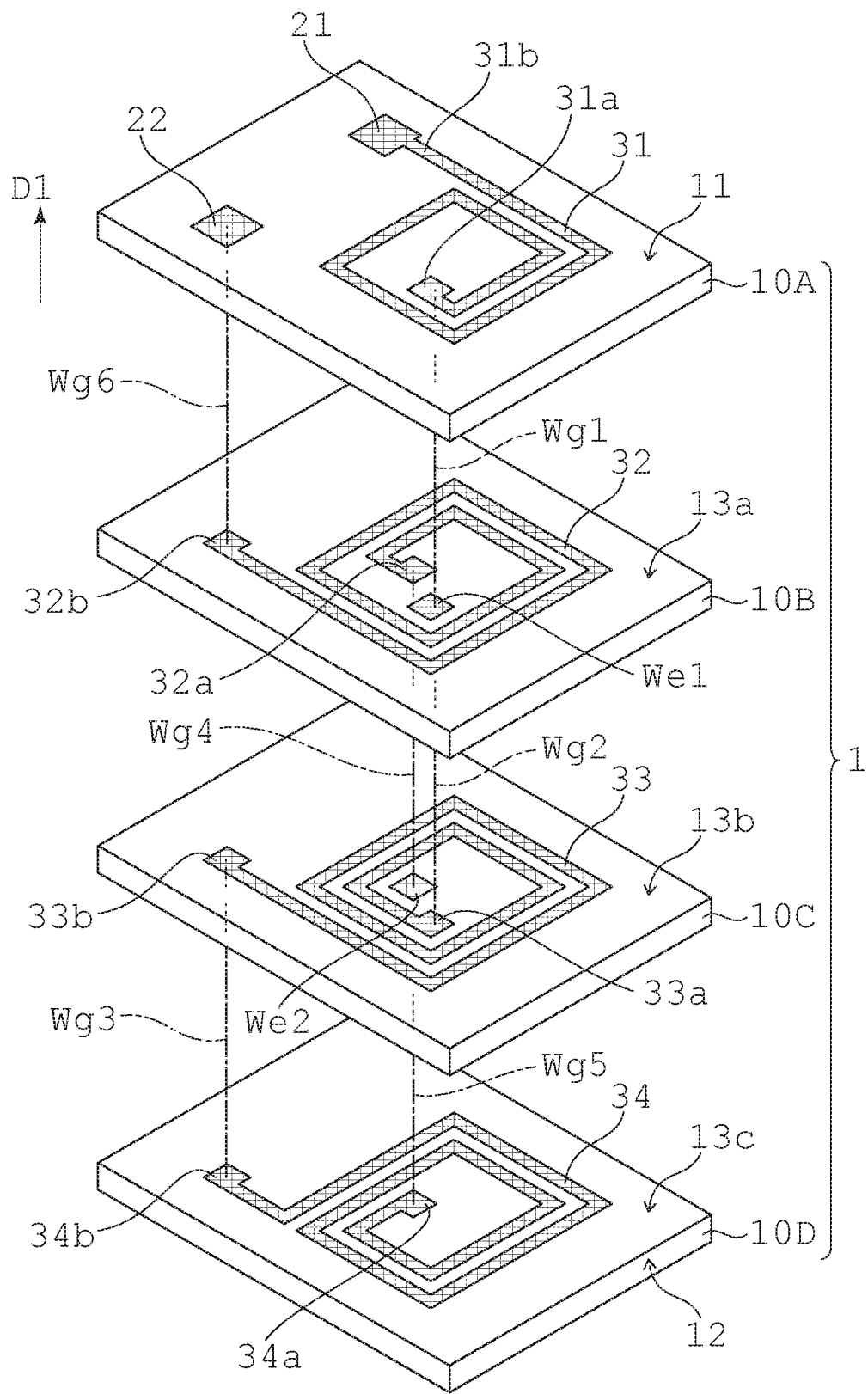
FIG. 7 is an exploded perspective view conceptually illustrating a multilayer substrate according to a fifth preferred embodiment of the present invention.

FIG. 7 is an exploded perspective view conceptually illustrating another example of the multilayer substrate having the above configuration. In the present preferred embodiment, the coil conductors 31 to 34 are provided such that the inner peripheral ends and the outer peripheral ends of the coil conductors 31 to 34 have the following positional relationships. That is, similarly to the first preferred embodiment, the outer peripheral end 31b of the coil conductor 31 is directly connected to the first external electrode 21, and the outer peripheral end 32b of the coil conductor 32 is provided at the position opposed to the second external electrode 22. The outer peripheral end 33b of the coil conductor 33 and the outer peripheral end 34b of the coil conductor 34 are provided at the positions opposed to each other.

In the surface, on the side of the first main surface 11, of the insulating base material 10B, an auxiliary conductor We1 for connection is provided at a position inside the coil conductor 32 and at a position separated from the coil conductor 32. In addition, the inner peripheral end 31a of the coil conductor 31 and the inner peripheral end 33a of the coil conductor 33 are provided at the positions opposed to each other while the auxiliary conductor We1 is interposed therebetween.

Moreover, in the surface, on the side of the first main surface 11, of the insulating base material 10C, an auxiliary conductor We2 for connection is provided at a position inside the coil conductor 33 and at a position separated from the coil conductor 33. The inner peripheral end 32a of the coil conductor 32 and the inner peripheral end 34a of the coil conductor 34 are provided at the positions opposed to each other while the auxiliary conductor We2 is interposed therebetween.

The coil conductors 31 to 34 are connected in series between the first external electrode 21 and the second external electrode 22 by wiring conductors. Specifically, in the present preferred embodiment, the coil conductors 31 to 34 are connected in the following manner such that current passes through the coil conductors 31 to 34 in the identical direction (that is, such that generated magnetic fields are intensified) when current is passed between the first external electrode 21 and the second external electrode 22.

In the first main surface 11, the outer peripheral end 31b of the coil conductor 31 is directly connected to the first external electrode 21. That is, the outer peripheral end 31b of the coil conductor 31 is directly connected to the first external electrode 21 without the coil conductors 32 to 34 interposed therebetween.

The wiring conductor includes the auxiliary conductors We1 and We2 and interlayer connection conductors Wg1 to Wg6 (to be described below). The interlayer connection conductors Wg1 to Wg6 are indicated by alternate long and short dash lines in FIG. 7.

The interlayer connection conductors Wg1, Wg2 are conductive vias provided in the insulating base materials 10A, 10B, respectively, and are linearly arranged from the inner peripheral end 31a of the coil conductor 31 to the inner peripheral end 33a of the coil conductor 33. The interlayer connection conductor Wg1 connects the inner peripheral end 31a of the coil conductor 31 with the auxiliary conductor We1. The interlayer connection conductor Wg2 connects the auxiliary conductor We1 with the inner peripheral end 33a of the coil conductor 33. Consequently, the inner peripheral end 31a of the coil conductor 31 and the inner peripheral end 33a of the coil conductor 33 are connected with each other without the coil conductors 32, 34 interposed therebetween.

The interlayer connection conductor Wg3 is a conductive via provided in the insulating base material 10C, and connects the outer peripheral end 33b of the coil conductor 33 with the outer peripheral end 34b of the coil conductor 34.

The interlayer connection conductors Wg4, Wg5 are conductive vias provided in the insulating base materials 10B, 10C, respectively, and are linearly arranged from the inner peripheral end 32a of the coil conductor 32 to the inner peripheral end 34a of the coil conductor 34. The interlayer connection conductor Wg4 connects the inner peripheral end 32a of the coil conductor 32 with the auxiliary conductor We2. The interlayer connection conductor Wg5 connects the auxiliary conductor We2 with the inner peripheral end 34a of the coil conductor 34. Consequently, the inner peripheral end 34a of the coil conductor 34 and the inner peripheral end 32a of the coil conductor 32 are connected with each other without the coil conductors 31, 33 interposed therebetween.

The interlayer connection conductor Wg6 is a conductive via provided in the insulating base material 10A, and connects the outer peripheral end 32b of the coil conductor 32 with the second external electrode 22. Consequently, the outer peripheral end 32b of the coil conductor 32 is directly connected to the second external electrode 22 without the coil conductors 31, 33, 34 interposed therebetween.

Figure 8:
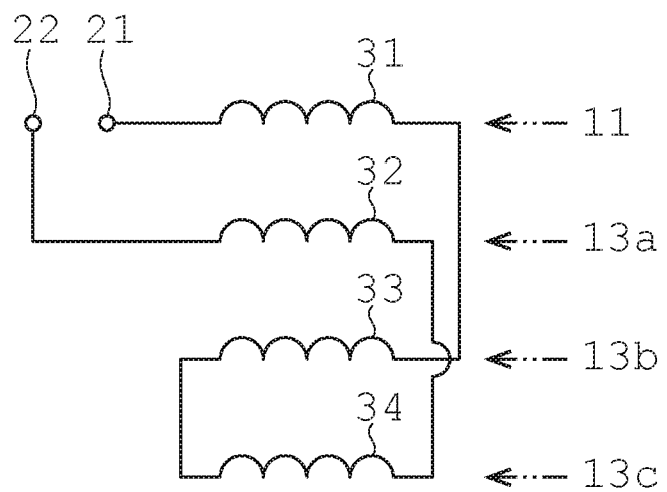
FIG. 8 is a diagram illustrating a circuit constructed on the multilayer substrate according to the fifth preferred embodiment of the present invention.

In such wiring, as illustrated in FIG. 8, a circuit is provided in which the coil conductors 31 to 34 are connected in series between the first external electrode 21 and the second external electrode 22. Specifically, the coil conductors 31 to 34 are connected in series in the order of the coil conductors 31, the coil conductors 33, the coil conductors 34, and the coil conductors 32 from the side closer to the first external electrode 21 in the electrical path of the circuit. Further, in the circuit, the coil conductors 31 to 34 may be used as a high-frequency coil or a low-frequency coil.

Sixth Preferred Embodiment

For example, in the laminated body 1 of FIG. 1, any one of the insulating base materials 10A to 10D may be smaller than other insulating base materials in the thickness in the lamination direction D1. As an example, the case is considered in which the insulating base material 10B is smaller than other insulating base materials in the thickness in the lamination direction D1. In this case, the electrical short circuit easily occurs between the two coil conductors 32, 33, which are adjacent to each other while the insulating base material 10B having the smaller thickness is interposed therebetween, during the hot pressing in the laminating step.

In such a case, preferably the multilayer substrate has the following configuration. That is, preferably the two coil conductors 32, 33 in which the electrical short circuit easily occurs are directly connected to the first external electrode 21 and the second external electrode 22, respectively, as the first coil conductor and the second coil conductor without other coil conductors interposed therebetween. Alternatively, preferably the coil conductor 32 is directly connected to the second external electrode 22, and the coil conductor 33 is directly connected to the first external electrode 21.

According to this configuration, in the lamination direction D1, the distance between the surface (laminated interface 13a) at which the first coil conductor (coil conductor 32) is provided and the surface (laminated interface 13b) at which the second coil conductor (coil conductor 33) is provided is smaller than the distance between the surfaces at which other coil conductors are provided (the distance between the first main surface 11 and the laminated interface 13a or the distance between the laminated interfaces 13b and 13c).

In this manner, preferably the two coil conductors adjacent to each other in the lamination direction D1, in which the electrical short circuit easily occurs, are directly connected to the first external electrode 21 and the second external electrode 22, respectively, as the first coil conductor and the second coil conductor without other coil conductors interposed therebetween. Therefore, the electrical short circuit is able to be accurately detected when the electrical short circuit is established between the two coil conductors.

The above-described preferred embodiments of the present invention (the connection relationship among the coil conductors 31 to 34 mainly between the first external electrode 21 and the second external electrode 22) may also be applied to the multilayer substrate in which all of the coil conductors 31 to 34 are provided in the laminated body 1 (that is, the laminated interfaces).

Further, the above-described preferred embodiments may also be applied to the multilayer substrate in which the formation surfaces of the coil conductors 31 to 34 on the insulating base materials 10A to 10D are reversed (that is, the formation surface is on the side of the second main surface 12).

Figure 9:
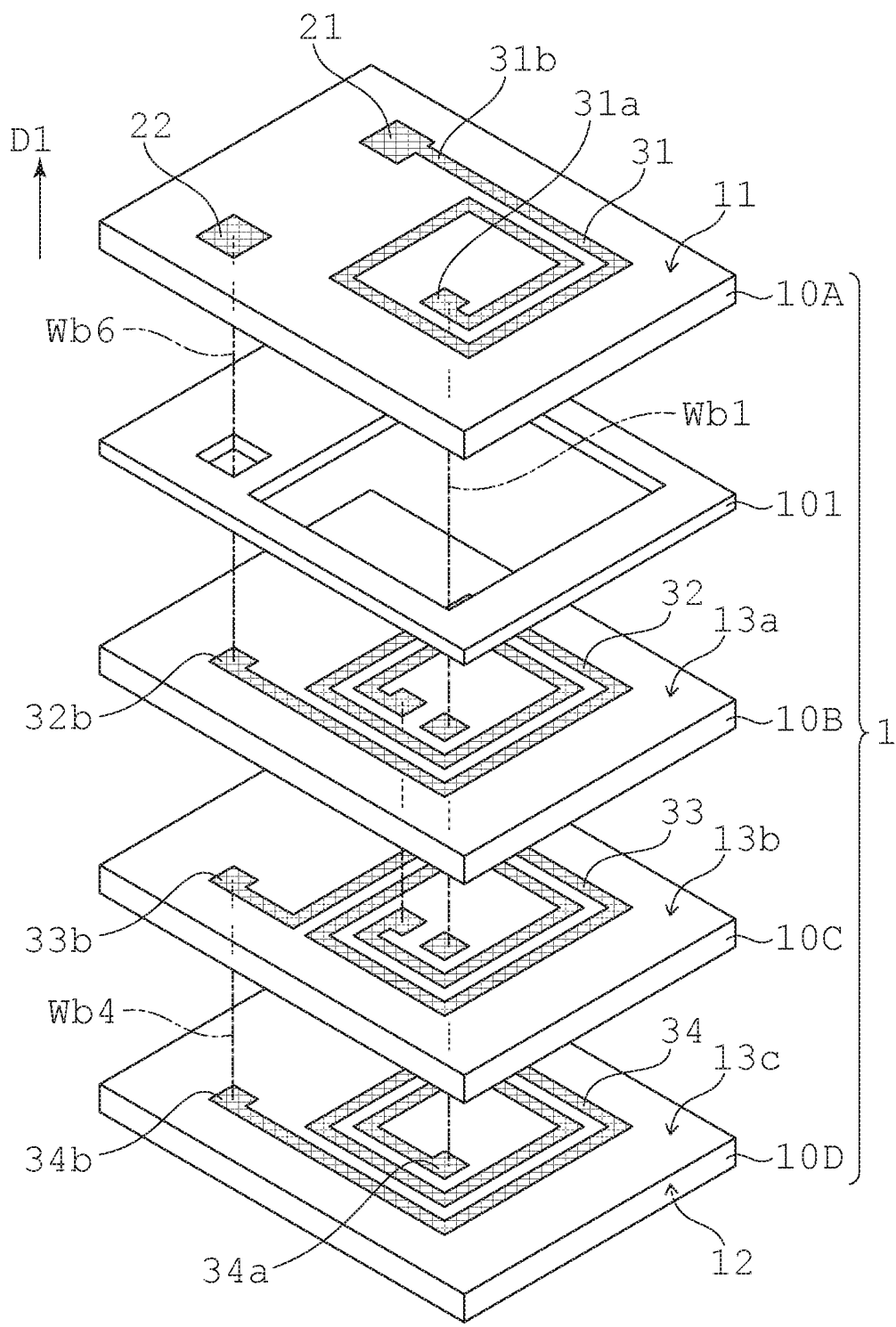
FIG. 9 is an exploded perspective view conceptually illustrating a multilayer substrate according to another preferred embodiment of the present invention.

Moreover, as illustrated in FIG. 9, the above-described preferred embodiments of the present invention may also be applied to a multilayer substrate in which an auxiliary insulating base material 101 is interposed between at least any two of the insulating base materials 10A to 10D. The auxiliary insulating base material 101 reduces a step height which may be disposed in the laminated body 1 due to the thickness of the coil conductor or the auxiliary conductor, and is disposed while avoiding a region at which a plurality of coil conductors or auxiliary conductors overlap each other. Specifically, the auxiliary insulating base material 101 preferably includes an opening provided in the region at which the plurality of coil conductors or auxiliary conductors overlap each other. According to the multilayer substrate, the step height that may be present due to the thicknesses of the coil conductors 31 to 34 or other elements in the lamination direction D1 is reduced to prevent the deviation or deformation of the insulating base materials 10A to 10D during the hot pressing. Consequently, positional changes of the coil conductors 31 to 34, disconnection of the interlayer connection conductor, and other defects are unlikely to occur.

Figure 10:
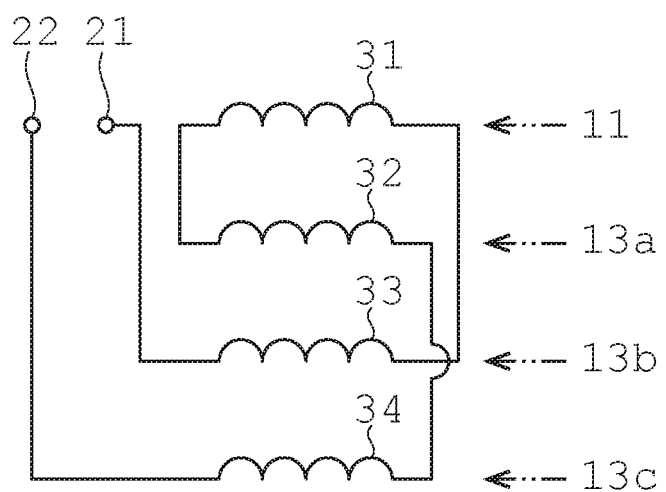
FIG. 10 is a diagram illustrating another example of the circuit constructed on the multilayer substrate.

As illustrated in FIG. 10, in the multilayer substrate, the coil conductors 31 to 34 may be connected in series in the order of the coil conductor 33, the coil conductor 31, the coil conductor 32, and the coil conductor 34 from the side closer to the first external electrode 21 in the electrical path.

The above-described preferred embodiments of the present invention are able to also be applied to a multilayer substrate including at least three coil conductors which are not limited to four coil conductors.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer substrate comprising:
a laminated body including a plurality of insulating base materials having thermoplasticity that are laminated together, the laminated body including a first main surface and a second main surface that are opposed to each other in a lamination direction of the insulating base materials;
a first external electrode and a second external electrode that are provided on the first main surface; and
at least three coil conductors that are respectively patterned on a plurality of different surfaces of the first main surface, the second main surface, and laminated interfaces of the plurality of insulating base materials and that are arranged in the lamination direction, the at least three coil conductors including a first coil conductor and a second coil conductor, the at least three coil conductors being connected in series between the first external electrode and the second external electrode; wherein
a surface of the plurality of different surfaces at which another coil conductor is provided is not interposed between two surfaces of the plurality of different surfaces at which the first coil conductor and the second coil conductor are provided, respectively;
the first coil conductor and the second coil conductor are directly connected to the first external electrode and the second external electrode, respectively, without another coil conductor interposed therebetween; and
a distance between the surface at which the first coil conductor is provided and the surface at which the second coil conductor is provided is smaller than a distance between surfaces at which other coil conductors adjacent to each other in the lamination direction are provided.

2. The multilayer substrate according to claim 1, wherein one of the two surfaces at which the first coil conductor and the second coil conductor are provided, respectively, is a surface having a smallest distance to the first main surface or the second main surface in the lamination direction among the plurality of different surfaces or a surface having a distance of zero and coinciding with the first main surface or the second main surface.

3. The multilayer substrate according to claim 2, wherein the laminated body includes:
a first region defined by a distance from the first main surface in the lamination direction to a surface at which one of the at least three coil conductors that is second from the first main surface is provided; and
a second region defined by a distance from the second main surface in the lamination direction to a surface at which another one of the at least three coil conductors that is second from the second main surface is provided; and
the two coil conductors located in one of the first and second regions having a smaller distance are directly connected to the first external electrode and the second external electrode, respectively, as the first coil conductor and the second coil conductor without another coil conductor interposed therebetween.

4. The multilayer substrate according to claim 2, wherein a coil conductor provided on a surface having a largest distance from the one of the two surfaces in the lamination direction among the plurality of different surfaces is a third coil conductor;
a connection path from the first coil conductor to the third coil conductor reaches the third coil conductor without returning on a way to the surface at which the first coil conductor is provided; and
a connection path from the third coil conductor to the second coil conductor reaches the second coil conductor without returning on a way to the surface at which the third coil conductor is provided.

5. The multilayer substrate according to claim 4, wherein the one of the two surfaces is a surface having a smallest distance to the first main surface in the lamination direction or a surface having a distance of zero and coinciding with the first main surface;
one of the first external electrode and the second external electrode and one of the first coil conductor and the second coil conductor are directly connected with each other without other surfaces interposed therebetween except for, from among the plurality of different surfaces, the surface at which the one coil conductor is provided;
the other of the first external electrode and the second external electrode and the other of the first coil conductor and the second coil conductor are directly connected with each other without other surfaces interposed therebetween except for, from among the plurality of different surfaces, the two surfaces at which the first coil conductor and the second coil conductor are provided, respectively.

6. The multilayer substrate according to claim 1, wherein each of the plurality of insulating base materials is made of a thermoplastic resin, has a rectangular shape, and has a same size.

7. The multilayer substrate according to claim 6, wherein the thermoplastic resin is a liquid crystal polymer or a thermoplastic polyimide.

8. The multilayer substrate according to claim 1, wherein the at least three coil conductors include four coil conductors that are respectively patterned on the first main surface, the second main surface, and two laminated interfaces of the plurality of insulating base materials.

9. The multilayer substrate according to claim 1, wherein coil axes of the at least three coil conductors are coaxial with one another.

10. The multilayer substrate according to claim 1, wherein projection images of the at least three coil conductors onto the first main surface at least partially overlap each other around coil axes thereof.

11. The multilayer substrate according to claim 1, wherein each of the at least three coil conductors includes a combination of a plurality of linear patterns structured to have a quadrangular spiral shape.

12. The multilayer substrate according to claim 1, wherein
at least one of the at least three coil conductors is wound a clockwise direction from an inner peripheral end to an outer peripheral end; and
at least another one of the at least three coil conductors is wound in a counterclockwise direction from an inner peripheral end to an outer peripheral end.

13. The multilayer substrate according to claim 1, wherein at least one of the plurality of insulating base materials is thicker than others of the plurality of insulating base materials.

14. A method for manufacturing a multilayer substrate, the method comprising:
a conductor forming step of forming, on a plurality of insulating base materials having thermoplasticity, a plurality of coil conductors, a first external electrode, a second external electrode, and a wiring conductor, the plurality of coil conductors including at least three coil conductors including a first coil conductor and a second coil conductor; and
a laminating step of laminating the plurality of insulating base materials to form a laminated body including a first main surface and a second main surface that are opposed to each other in a lamination direction of the insulating base materials; wherein
the conductor forming step includes:
  a step of forming the first external electrode and the second external electrode on an insulating base material defining the first main surface;
  a step of forming the plurality of coil conductors respectively on insulating base materials defining a plurality of different surfaces of the first main surface, the second main surface, and laminated interfaces of the insulating base materials; and
  a step of forming the wiring conductor on the plurality of insulating base materials such that the first coil conductor and the second coil conductor are directly connected to the first external electrode and the second external electrode, respectively, without another coil conductor interposed therebetween while the plurality of coil conductors are connected in series between the first external electrode and the second external electrode in the laminated body;
the laminating step includes a step of laminating the plurality of insulating base materials to collectively hot press the plurality of insulating base materials in the laminated body to be formed such that the plurality of coil conductors are arranged in the lamination direction, and such that a surface at which another coil conductor is disposed is not interposed between two surfaces at which the first coil conductor and the second coil conductor are disposed, respectively; and
a distance between the surface at which the first coil conductor is provided and the surface at which the second coil conductor is provided is smaller than a distance between surfaces at which other coil conductors adjacent to each other in the lamination direction are provided.

15. A multilayer substrate comprising:
a laminated body including a plurality of insulating base materials having thermoplasticity that are laminated together, the laminated body including a first main surface and a second main surface that are opposed to each other in a lamination direction of the insulating base materials;
a first external electrode and a second external electrode that are provided on the first main surface; and
at least three coil conductors that are respectively patterned on a plurality of different surfaces of the first main surface, the second main surface, and laminated interfaces of the plurality of insulating base materials and that are arranged in the lamination direction, the at least three coil conductors including a first coil conductor and a second coil conductor, the at least three coil conductors being connected in series between the first external electrode and the second external electrode; wherein
a surface of the plurality of different surfaces at which another coil conductor is provided is not interposed between two surfaces of the plurality of different surfaces at which the first coil conductor and the second coil conductor are provided, respectively;
the first coil conductor and the second coil conductor are directly connected to the first external electrode and the second external electrode, respectively, without another coil conductor interposed therebetween;
one of the two surfaces at which the first coil conductor and the second coil conductor are provided, respectively, is a surface having a smallest distance to the first main surface or the second main surface in the lamination direction among the plurality of different surfaces or a surface having a distance of zero and coinciding with the first main surface or the second main surface;
the laminated body includes:
  a first region defined by a distance from the first main surface in the lamination direction to a surface at which one of the at least three coil conductors that is second from the first main surface is provided; and
  a second region defined by a distance from the second main surface in the lamination direction to a surface at which another one of the at least three coil conductors that is second from the second main surface is provided; and
the two coil conductors located in one of the first and second regions having a smaller distance are directly connected to the first external electrode and the second external electrode, respectively, as the first coil conductor and the second coil conductor without another coil conductor interposed therebetween.

\* \* \* \* \*